United States Patent
Sadayuki

(10) Patent No.: US 6,525,362 B2
(45) Date of Patent: Feb. 25, 2003

(54) IC CHIP FOR CONTACTLESS IC CARD

(75) Inventor: Eiichi Sadayuki, Ibaraki (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/986,270

(22) Filed: Nov. 8, 2001

(65) Prior Publication Data

US 2002/0056865 A1 May 16, 2002

(30) Foreign Application Priority Data

Nov. 16, 2000 (JP) ........................................ 2000-348873

(51) Int. Cl.$^7$ ............................................... H01L 29/76
(52) U.S. Cl. ....................... 257/298; 257/298; 257/295; 257/303; 363/16; 363/347; 363/28; 363/29; 363/71; 235/492; 235/380; 235/449; 235/487
(58) Field of Search .................................. 257/298, 297, 257/903; 235/492, 380, 449, 487; 340/825.54, 825.34; 363/16, 347, 28, 29, 71

(56) References Cited

U.S. PATENT DOCUMENTS

| | | | | |
|---|---|---|---|---|
| 4,720,626 A | | 1/1988 | Nishikawa et al. | ......... 235/449 |
| 6,070,794 A | * | 6/2000 | Niwata et al. | ............... 235/380 |
| 6,079,622 A | * | 6/2000 | Goto | ............................ 235/492 |
| 6,343,022 B1 | * | 1/2002 | Naruse | ......................... 363/16 |
| 2001/0013814 A1 | * | 8/2001 | Arisawa | ..................... 332/115 |
| 2001/0027532 A1 | * | 10/2001 | Hoshino et al. | ............ 713/340 |

FOREIGN PATENT DOCUMENTS

JP          59212949          12/1984

\* cited by examiner

Primary Examiner—Nathan J. Flynn
Assistant Examiner—Fazli Erdem
(74) Attorney, Agent, or Firm—Parkhurst & Wendel, L.L.P.

(57) ABSTRACT

To provide an IC chip for contactless IC card that ensures reliabilities such as data retention of nonvolatile memory and reduces power consumption. Power supply voltages $V_{DD}$ and $V_{SS}$, which are output from a rectifier circuit, are used as a power supply for driving an analog circuit, digital circuit, and memory control circuit to cause them to operate at low voltages. A booster circuit is provided for generating a power supply voltage $V_{DDM}$, which is a boost voltage, to drive a memory circuit. Because the memory circuit can be operated at the same, high voltage and the other circuits can be operated at lower voltages than voltages that would be used in a case where the analog circuit, digital circuit, memory control circuit and memory circuit are driven by a common power supply, power consumption can be reduced. In addition, because the power supply voltage $V_{DD}$ is separated from the power supply voltage $V_{DDM}$, malfunctions in the other circuits due to power-supply noise during memory circuit operation can be prevented.

5 Claims, 6 Drawing Sheets

IC CHIP FOR CONTACTLESS IC CARD

FIELD OF THE INVENTION

The present invention relates to a contactless IC card mounting IC chip having analog, digital, and memory circuits on the IC chip.

BACKGROUND OF THE INVENTION

A contactless IC card mounts antenna coils and IC chips and communicates with a terminal called a reader/writer by wireless to implement various functions such as authentication.

Electric power for driving the IC chip is obtained by receiving an electromagnetic wave transmitted from the reader/writer.

FIG. 7 shows an IC chip for a contactless IC card according to the prior art.

In FIG. 7, reference number 1 denotes an antenna coil, 2 denotes a resonance capacitance, 3 denotes a rectifier circuit, 4 denotes a smoothing capacitance, 5 denotes a analog circuit, 6 denotes a digital circuit, 7 denotes a memory control circuit, and 8 denotes a memory circuit.

An electromagnetic wave transmitted from the reader/writer is received by the antenna coil 1. The resonance capacitance 2 is connected to the antenna coil 1 in parallel so as to resonate at the frequency of the electromagnetic wave. An AC signal received by the antenna coil 1 is converted into a DC signal by the rectifier circuit 3. The smoothing capacitance 4 is connected in parallel across the outputs $V_{DD}$–$V_{SS}$ of the rectifier circuit 3 and smoothes a rectified ripple waveform. The outputs $V_{DD}$ and $V_{SS}$ of the rectifier circuit are connected to the analog circuit 5, digital circuit 6, memory control circuit 7, and memory circuit 8.

The analog circuit 5 comprises components such as a demodulator circuit for decoding receive data superimposed on the carrier of the electromagnetic wave and a modulator circuit for superimposing a transmission signal generated by the digital circuit 6 on the carrier of the electromagnetic wave.

The digital circuit 6 comprises components such as a CPU for performing various digital signal processes. The memory control circuit 7 controls the operation of the memory circuit 8. The memory circuit 8 is nonvolatile memory.

The nonvolatile memory requires a relatively high power-supply voltage ($V_{DD}$=5 volts) in order to ensure the retention of data written in memory cells. On the other hand, the analog circuit 5, digital circuit 6, and memory control circuit 7 today require lower power-supply voltages ($V_{DD}$=2.5 to 3.3 volts) because their transistors have been miniaturized. The prior-art IC chip for contactless IC card is capable of operating at a power-supply voltage $V_{DD}$ of over approximately 5 volts.

DISCLOSURE OF THE INVENTION

In the prior-art IC chip for a contactless IC card as described above, a minimum value of a power-supply voltage $V_{DD}$ at which the IC chip can be operated is limited by a minimum value of a voltage (VDD=5 volts) at which a memory circuit 8 can be operated because an analog circuit 5, a digital circuit 6, a memory control circuit 7, and the memory circuit 8 share a common power supply.

Therefore, the IC chip cannot be operated at a lower voltage and a communication distance to a reader/writer cannot be increased.

In addition, power-supply noise generated during the operation of the memory circuit 8 propagates to the analog circuit 5 to cause malfunctions in circuits such as a demodulator circuit. The power-supply noise can be reduced by increasing capacity of a smoothing capacitance 4. However, it is difficult to increase the capacity to such an extent that the power-supply noise can be eliminated, because the decoding capability of the demodulator circuit in the analog circuit 5 is decreased.

It is an object of the present invention to provide an IC chip for a contactless IC card that ensures reliability in data retention of nonvolatile memory and the like, and consumes lower power.

It is another object of the present invention to provide an IC chip for a contactless IC card that can prevent malfunctions in other circuits due to power-supply noise during an operation of a memory circuit.

An IC chip for a contactless IC card according to aspect 1 of the present invention is an IC chip for a contactless IC card for rectifying and smoothing a signal provided contactlessly from an external source to feed required electric power to internal signal processing circuits and a memory circuit to read and write data to and from that memory circuit, wherein the signal provided contactlessly from the external source is rectified, smoothed and provided to the signal processing circuits and the signal provided contactlessly from the external source is boosted by a booster circuit and provided to the memory circuit.

According to this configuration, the booster circuit is provided to cause the memory circuit having nonvolatile memory to operate at a boosted voltage and the other circuits to operate at a lower voltage, thus enabling lowered power consumption while ensuring the reliability in data retention of the nonvolatile memory and the like. In addition, because the power supply line for the memory circuit is separated from the power supply lines for the other circuits, malfunctions in the other circuits due to power-supply noise during memory circuit operation can be prevented.

The IC chip for contactless IC card according to aspect 2 of the present invention is characterized in that the memory according to aspect 1 is a ferroelectric memory.

The IC chip for contactless IC card according to aspect 3 of the present invention is characterized in that in aspect 1, the booster circuit boosts an output voltage output by rectifying and smoothing the signal provided contactlessly from the external source by switching the output voltage by using a clock signal repeatedly outputted, and charges a storage capacitance with the boosted output to supply power to the memory circuit.

The IC chip for contactless IC card according to aspect 4 is characterized in that in aspect 3, a resistance is inserted in series in a charging circuit from the boosted output to the storage capacitance to supply power from the storage capacitance to the memory circuit.

According to this configuration, a resistance provided between a boosted voltage output terminal and a storage capacitance produces a difference in impedance, and this difference facilitates a current supply from the storage capacitance to the memory circuit, thereby preventing malfunctions in the other circuits due to power-supply noise during a memory circuit operation even when the memory circuit operates and instantaneously consumes a high current.

The IC chip for a contactless IC card according to aspect 5 is characterized in that in aspect 3, the storage capacitance is charged by the output boosted by the booster circuit to supply power to the memory circuit, and that a boosting operation is stopped by detecting that the output voltage from the booster circuit exceeds a predetermine voltage, and the boost operation is automatically restarted by detecting that the output voltage drops below the predetermined voltage.

According to this configuration, power consumption can be reduced because the voltage boosting operation is stopped when the boosted voltage exceeds a predetermined voltage. In addition, since the boosted voltage does not become higher than the predetermined voltage, deterioration of devices due to excessive boosting can be prevented.

DESCRIPTION OF THE EMBODIMENTS

Embodiments of the present invention will be described below with reference to FIGS. 1 through 6.

First Embodiment

Figure 1:
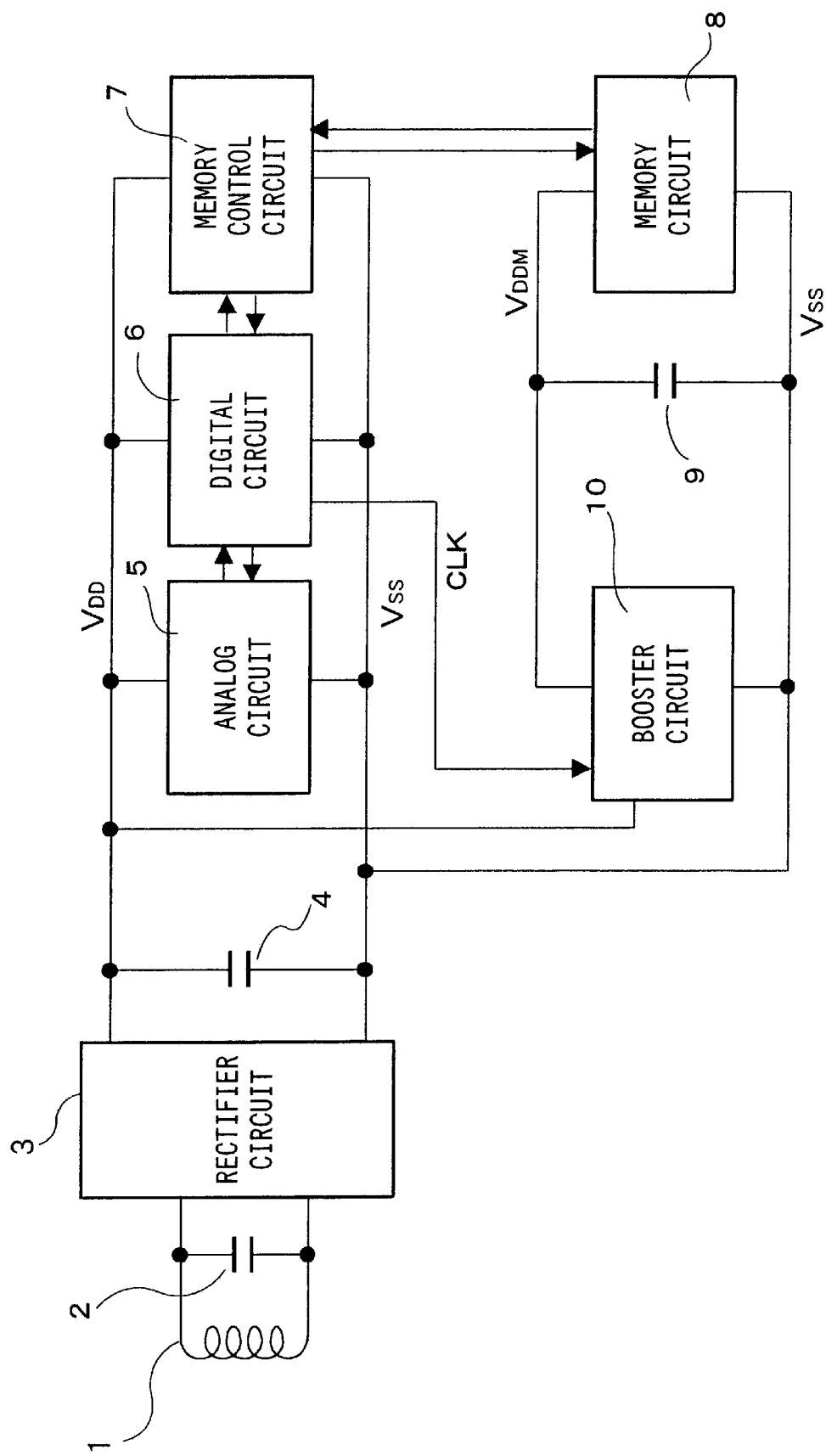
FIG. 1 is a block diagram of an IC chip for a contactless IC card according to a first embodiment of the present invention.
Figure 2:
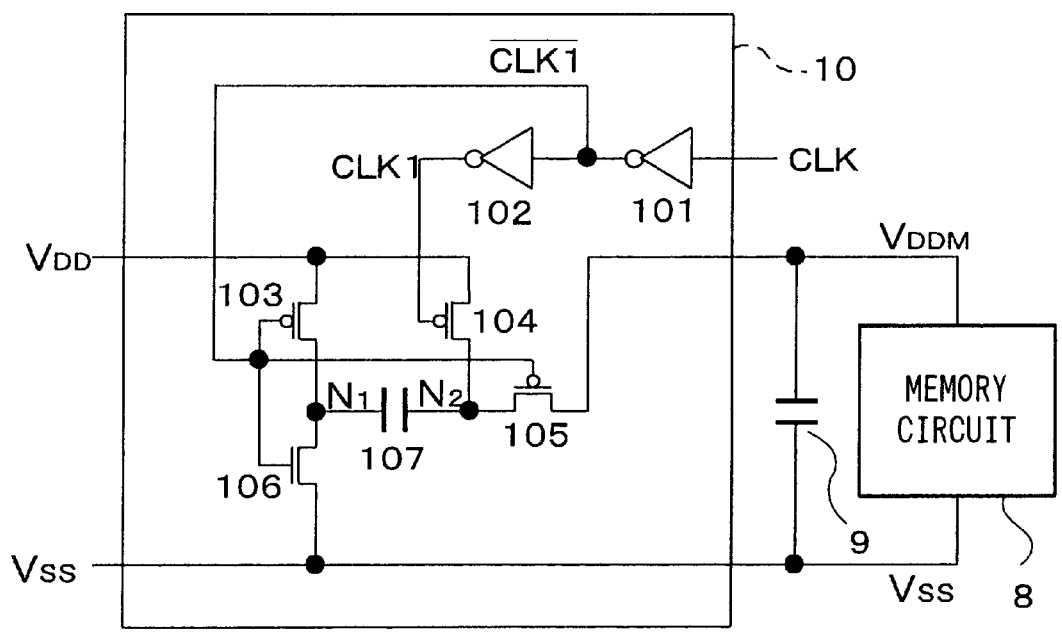
FIG. 2 is a schematic diagram of a booster circuit and its periphery according to the first embodiment of the present invention.
Figure 4:
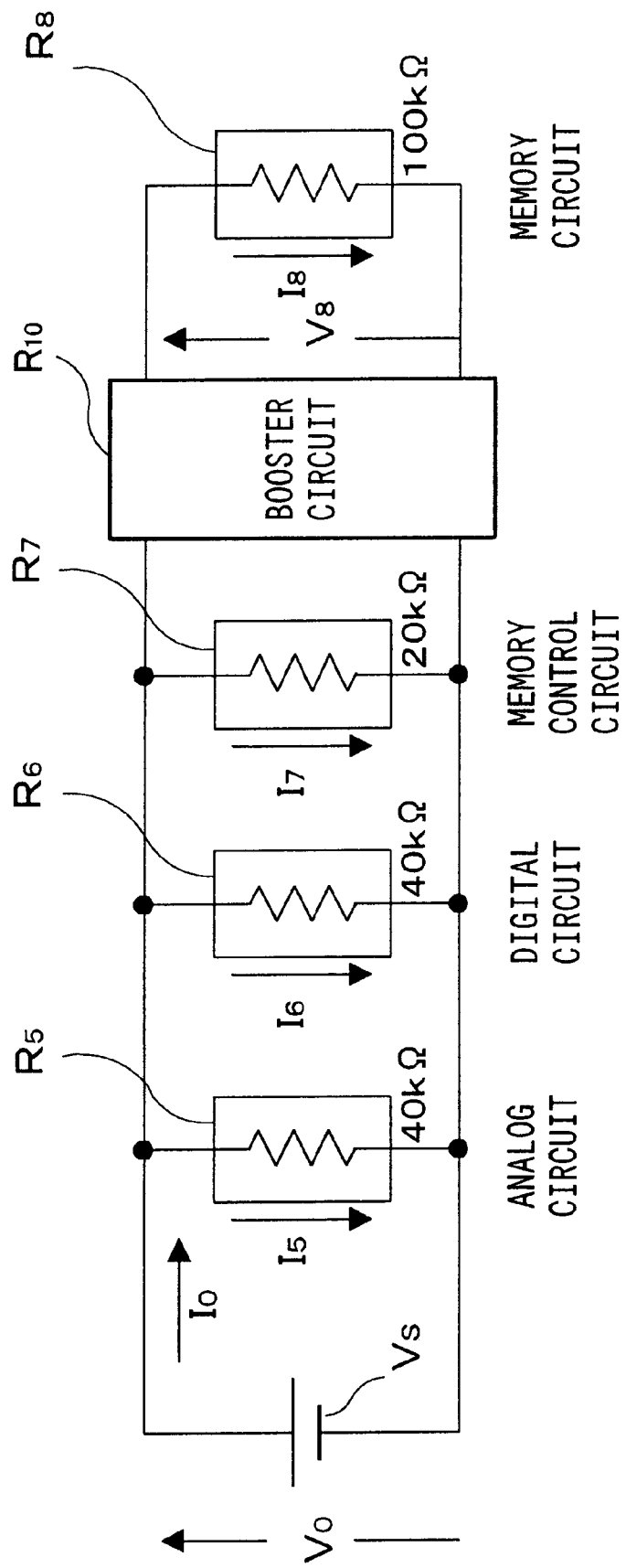
FIG. 4 is an equivalent circuit of power consumption according to the first embodiment of the present invention.

FIGS. 1, 2, and 4 show a first embodiment of the present invention.

FIG. 1 shows an IC chip for a contactless IC card according to the first embodiment of the present invention.

In FIG. 1, reference number 1 denotes an antenna coil, 2 denotes a resonance capacitance, 3 denotes a rectifier circuit, 4 denotes a smoothing capacitance, 5 denotes an analog circuit, 6 denotes a digital circuit, 7 denotes a memory control circuit, 8 denotes a memory circuit, 9 denotes a storage capacitance, and 10 denotes a booster circuit. Ferroelectric memory is used as the memory circuit 8 in this embodiment.

The resonance capacitance 2 is connected to the antenna coil 1 in parallel to form a resonance circuit. The output of antenna coil 1 is input into the rectifier circuit 3. The output power supply $V_{DD}$–$V_{SS}$ from the rectifier 3 is input into the analog circuit 5, digital circuit 6, memory control circuit 7, and booster circuit 10. The smoothing capacitance 4 is connected across the output $V_{DD}$–$V_{SS}$.

A clock signal CLK is output from the digital circuit 6 and input into the booster circuit 10. The output power supply $V_{DDM}$–$V_{SS}$ from the booster circuit 10 is input into the memory circuit 8. A control signal and a data signal are communicated among the analog circuit 5, digital circuit 6, memory control circuit 7, and memory circuit 8. The functions of the antenna coil 1, resonance capacitance 2, rectifier circuit 3, smoothing capacitance 4, analog circuit 5, digital circuit 6, memory control circuit 7, and memory circuit 8 are equivalent to those described in the description of the example of the prior art.

It is assumed that a clock signal generation circuit is provided in the digital circuit 6 for generating a clock signal CLK.

FIG. 2 shows a booster circuit 10. The memory circuit 8 and a storage capacitance 9 are also shown in FIG. 2.

In FIG. 2, reference numbers 101 and 102 denote CMOS inverters, 103, 104, and 105 denote P-channel MOS transistors, 106 denotes a N-channel MOS transistor, 107 denotes a pumping capacitance, and $N_1$ and $N_2$ denote nodes.

The CMOS inverter 101 receives clock signal CLK as its input and outputs inverted clock signal $\overline{CLK1}$. The CMOS inverter 102 receives inverted clock signal $\overline{CLK1}$ as its input and outputs clock signal CLK1.

The P-channel MOS transistor 103 has the gate connected to inverted clock signal $\overline{CLK1}$, the source connected to power supply $V_{DD}$, and the drain connected to node $N_1$. The P-channel transistor 104 has the gate connected to clock signal CLK1, the source connected to power supply $V_{DD}$, and the drain connected to node $N_2$. The P-channel MOS transistor 105 has the gate connected to inverted clock signal $\overline{CLK1}$, source connected to node $N_2$, and drain connected to power supply $V_{DDM}$. The NMOS transistor 106 has the gate connected to inverted clock signal $\overline{CLK1}$, source connected to power supply $V_{SS}$, and drain connected to node $N_1$. One end of the pumping capacitance 107 is connected to node $N_1$ and the other end is connected to node $N_2$.

In this configuration, inverted clock signal $\overline{CLK1}$ is high and clock signal CLK1 is low when clock signal CLK is low.

At this time point, the PMOS transistor 103 is in an OFF state, the NMOS transistor 106 is in an ON state, the PMOS transistor 104 is ON, PMOS transistor 105 is OFF, node $N_1$ is connected to power supply $V_{SS}$, node $N_2$ is connected to power supply $V_{DD}$, and voltage $V_{DD}$–$V_{SS}$ is applied across the pumping capacitance 107.

Node $N_2$ is separated from power supply $V_{DDM}$ because the PMOS transistor 105 is in the OFF state. When clock signal CLK goes high, inverted clock signal $\overline{CLK1}$ goes low and clock signal CLK1 goes high. At this time point, the PMOS transistor 103 is ON, the NMOS transistor 106 is OFF, the PMOS transistor 104 is OFF, the PMOS transistor 105 is ON, the potential of node $N_1$ is boosted from $V_{SS}$ to $V_{DD}$, and the potential of node $N_2$ is boosted from $V_{DD}$ to $2 \times V_{DD}$.

A charge caused by this voltage boost is stored in a storage capacitance 9 through the PMOS transistor 105. The charge stored in the storage capacitance 9 is consumed by the operation of the memory circuit 8. Charges are constantly supplied to the storage capacitance 9 by the operation described above because consecutive clock signals CLK at H/L levels are input.

As comparing FIG. 3, which shows an example of the prior art, with FIG. 4, which shows the embodiment of the present invention, the effect of power consumption in the IC chip for contactless IC card (of the first embodiment) will be described below.

Figure 3:
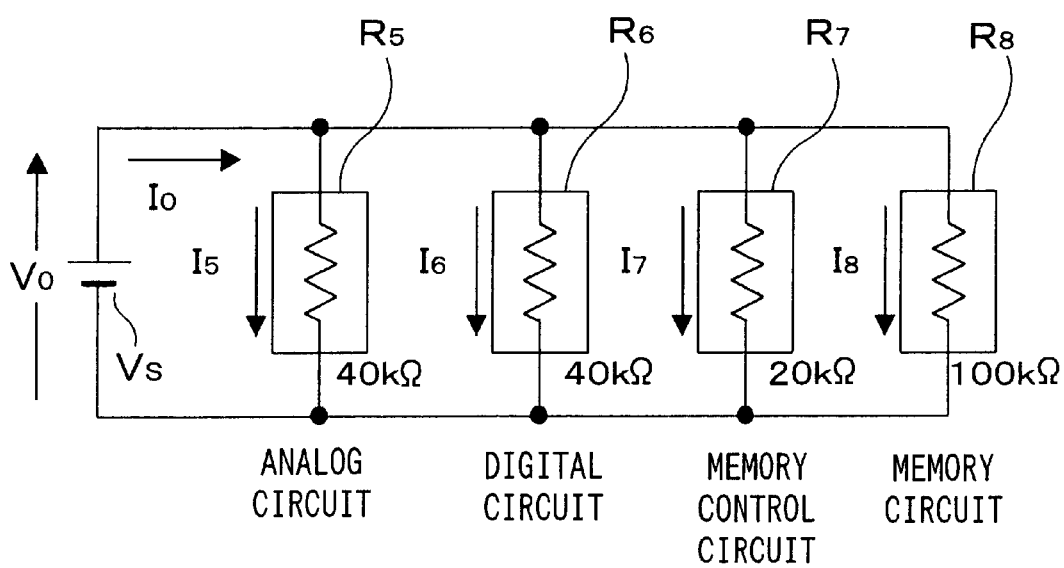
FIG. 3 is a schematic diagram showing an equivalent circuit of consumption power in an IC chip for a contactless IC card according to a prior art.

FIG. 3 is a schematic diagram in which an analog circuit 5, digital circuit 6, memory control circuit 7, and memory circuit 8 in an IC chip for a contactless IC card are replaced with equivalent resistances for calculating power consumption.

Here, $V_s$ represents a DC voltage power supply, $R_5$ represents the equivalent resistance of the analog circuit 5, $R_6$ represents the equivalent resistance of the digital circuit 6, $R_7$ represents the equivalent resistance of the memory control circuit 7, and $R_8$ represents the equivalent resistance of the memory circuit 8.

$I_0$, $I_5$, $I_6$, $I_7$, and $I_8$ represent currents passing through the DC voltage power supply $V_s$, equivalent resistances $R_5$, $R_6$, $R_7$, and $R_8$, respectively. The operating voltage in this prior-art IC chip for contactless IC card is approximately 5 volts.

Letting $V_0$=5 volts, equivalent resistance $R_5$=20 kΩ, $R_6$=40 kΩ, $R_7$=40 kΩ, and $R_8$=100 kΩ, then current $I_5$=250 μA, $I_6$=125 μA, $I_7$=125 μA, and $I_8$=50 μA, making a total $I_0$=550 μA. As a result, power consumption in the whole IC chip is $V_0$ % $I_0$=2,750 μW.

To the contrary, the analog circuit 5, digital circuit 6, memory control circuit 7, and memory circuit 8 in the IC chip for contactless IC card according to the first embodiment are, like in FIG. 3, replaced with equivalent resistances as shown in FIG. 4. Letting the input voltage $V_0$ of the booster circuit be 2.5 volts, the output voltage $V_8$ be 5 volts, and the efficiency be 50%, then current $I_5$=120 μA, $I_6$=62.5 μA, $I_7$=62.5 μA, and $I_8$=50 μA. Power consumption by equivalent resistances $R_5$, $R_6$, and $R_7$ is $$V_0 \times (I_5+I_6+I_7)=625 \text{ μW}.$$

Power consumption by equivalent resistance $R_8$ is $V_8 \times I_8$=250 μW. Taking into account the efficiency of the booster circuit 10 of 50%, power consumption in the entire IC chip is $$625 \text{ μW}+2 \times 250 \text{ μW}=1,125 \text{ μW}.$$

Thus, the power consumption in the IC chip for a contactless IC card in the first embodiment according to the present invention can be reduced to 1,125 μW, that is 40% of the power consumption of 2,750 μW in the IC chip for a contactless IC card according to the above described prior art.

As described above, power consumption in the IC chip for a contactless IC card can be reduced by providing the booster circuit 10 and driving the memory circuit 8 at a boosted voltage and the other circuits at lower voltages. Because the reduction in power consumption enables the IC chip for a contactless IC card to be operated by a lower electromagnetic wave power, the communication distance to a reader/writer can be increased. In addition, such operation as writing can be performed at a higher voltage in the memory circuit 8 using nonvolatile memory, therefore the reliability in data retention of the volatile memory can be ensured.

Furthermore, power consumed by operations in the memory circuit 8 is supplied by the storage capacitance 9 and the power line for the power supply $V_{DD}$ is separated from the power line for the memory circuit power supply $V_{DDM}$, therefore the other circuits such as an analog circuit is less prone to being affected by power supply noise during memory circuit operation. That is, malfunctions in the other circuits due to power supply noise during memory circuit operation can be prevented.

Second Embodiment

Figure 5:
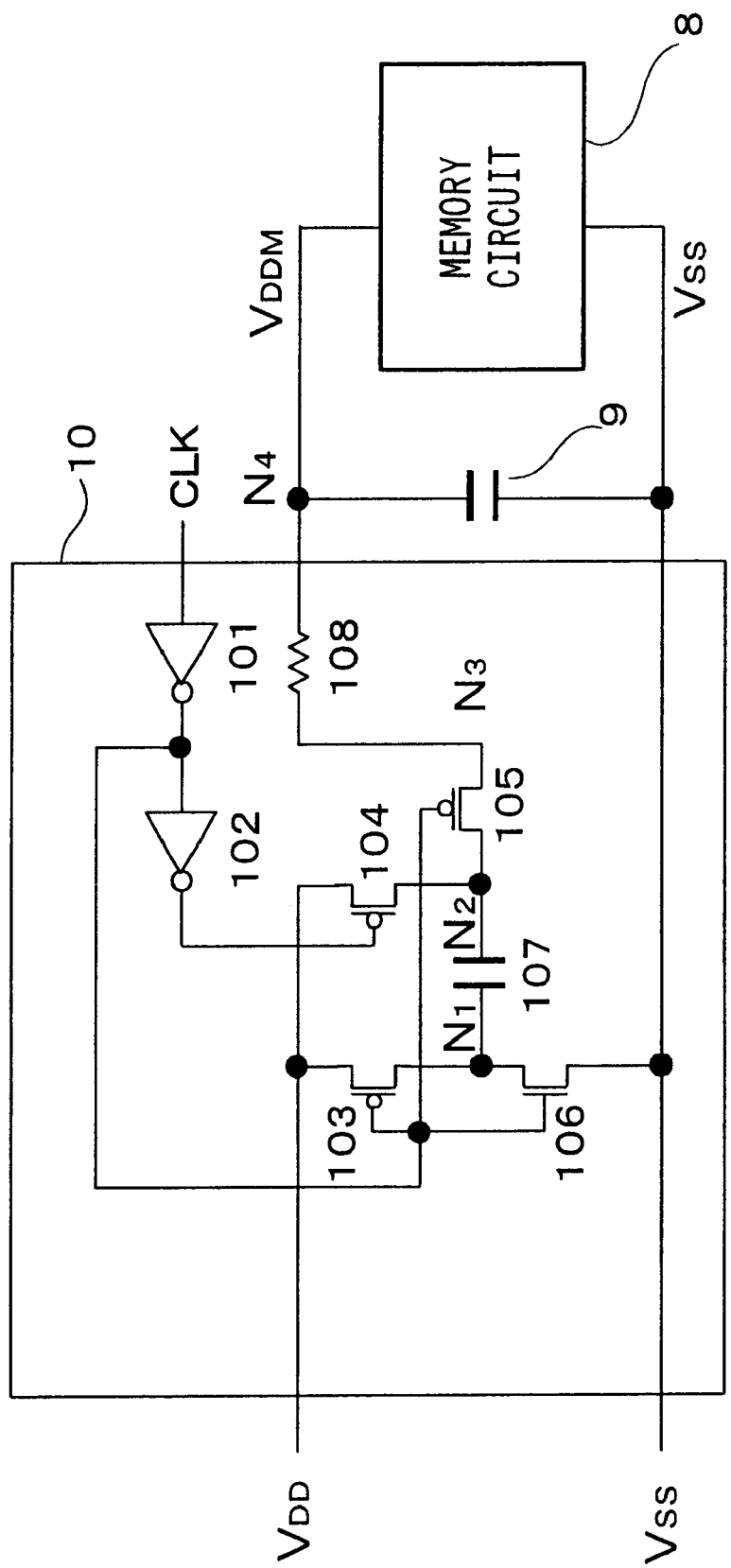
FIG. 5 is a schematic diagram of a booster circuit and its periphery in an IC chip for a contactless IC card according to a second embodiment of the present invention.

FIG. 5 shows another example of the booster circuit 10 (in the first embodiment) shown in FIG. 2. The second embodiment is the same as the first embodiment except that a resistance 108 is connected between node $N_3$, which is the drain of a PMOS transistor, and node $N_4$, which is power supply $V_{DDM}$. Other components of the IC chip for contactless IC card are the same as those in the first embodiment.

In the IC chip for contactless IC card (of the second embodiment) configured as described above, the operations of a CMOS inverter 101, CMOS inverter 102, PMOS transistor 103, PMOS transistor 104, PMOS transistor 105, NMOS transistor 106, and pumping capacitance 107 when a clock signal CLK is either low or high are the same those in the first embodiment.

An operation when the clock signal CLK is high and a memory circuit 8 instantaneously consumes a high current will be described below.

When the clock signal CLK is high, both of the PMOS transistors 103 and 105 are in the on state. That is, power supply $V_{DD}$ is connected to node $N_3$ through the PMOS transistor 103, pumping capacitance 107, and PMOS transistor 105.

At this point, if the memory circuit 8 operates and instantaneously consumes a current, the current is supplied from a storage capacitance 9 and, in addition, a current would flow from a node $N_3$. Such a current in general is supplied from a node at a lower impedance. Here, since the current supply from the node $N_3$ is added with impedance of the resistance 108, it hardly occurs in contrast to the current supply from the storage capacitance 9. If the current supply from the node $N_3$ should occur, power supply $V_{DD}$ would vary through the route from PMOS transistor 103 to pumping capacitance 107 to PMOS transistor 105. However, because the resistance 108 is provided, the current consumed by the memory circuit 8 is mostly supplied from the storage capacitance and the variation in power supply $V_{DD}$ is inhibited.

When a clock signal CLK is low, the PMOS transistor 105 is in the off state and therefore no current from node $N_3$ is provided to the memory circuit 8 and power supply $V_{DD}$ will not vary.

As described above, the current is supplied from the storage capacitance 9 to the memory circuit 8 and no current is supplied from power supply $V_{DD}$ and therefore power supply $V_{DD}$ does not vary even when the memory circuit 8 operates and consumes instantly a high current, because three is a difference in impedance produced by the resistance 108 provided between node $N_3$ and node $N_4$. That is, malfunctions in the other circuits due to power supply noise during a memory circuit operation can be prevented more reliably.

Third Embodiment

Figure 6:
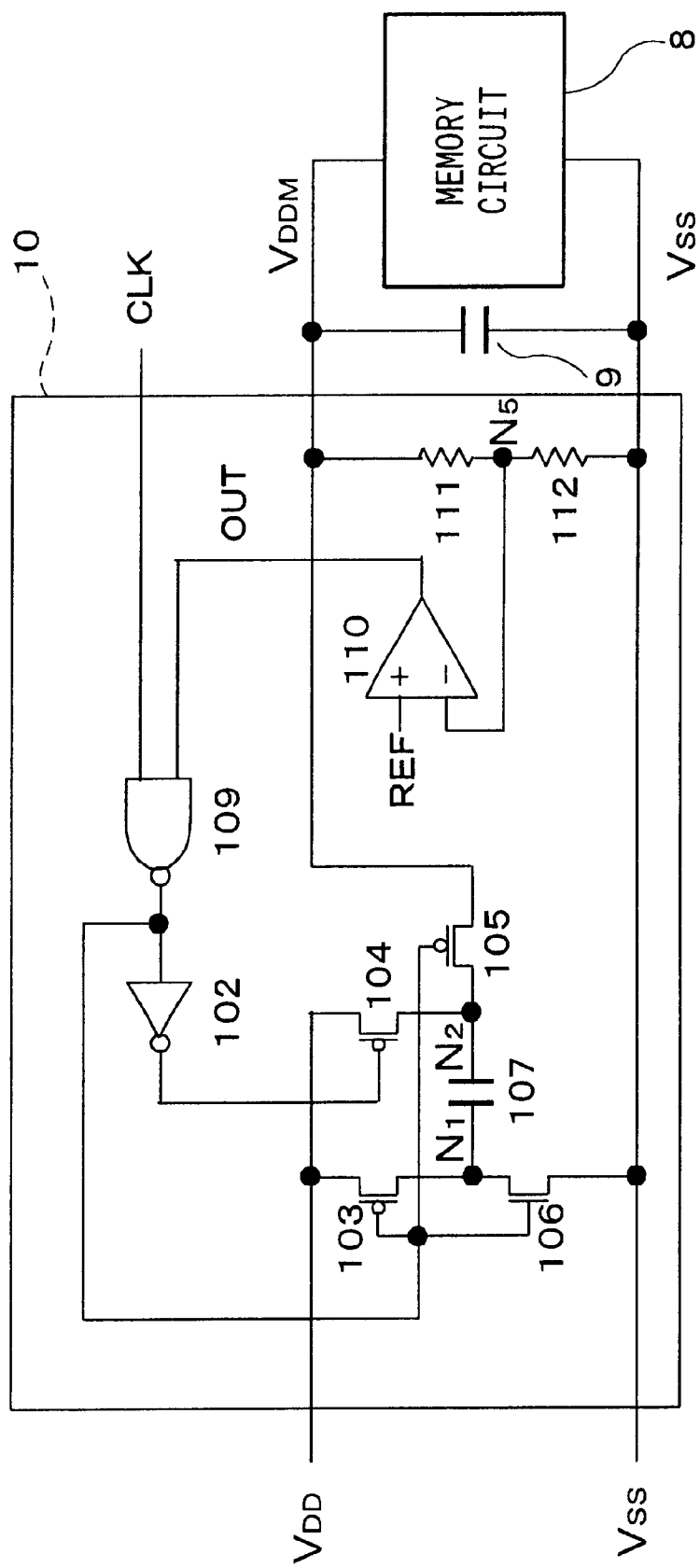
FIG. 6 is a schematic diagram of a booster circuit and its periphery in an IC chip for contactless IC card according to a third embodiment of the present invention.
Figure 7:
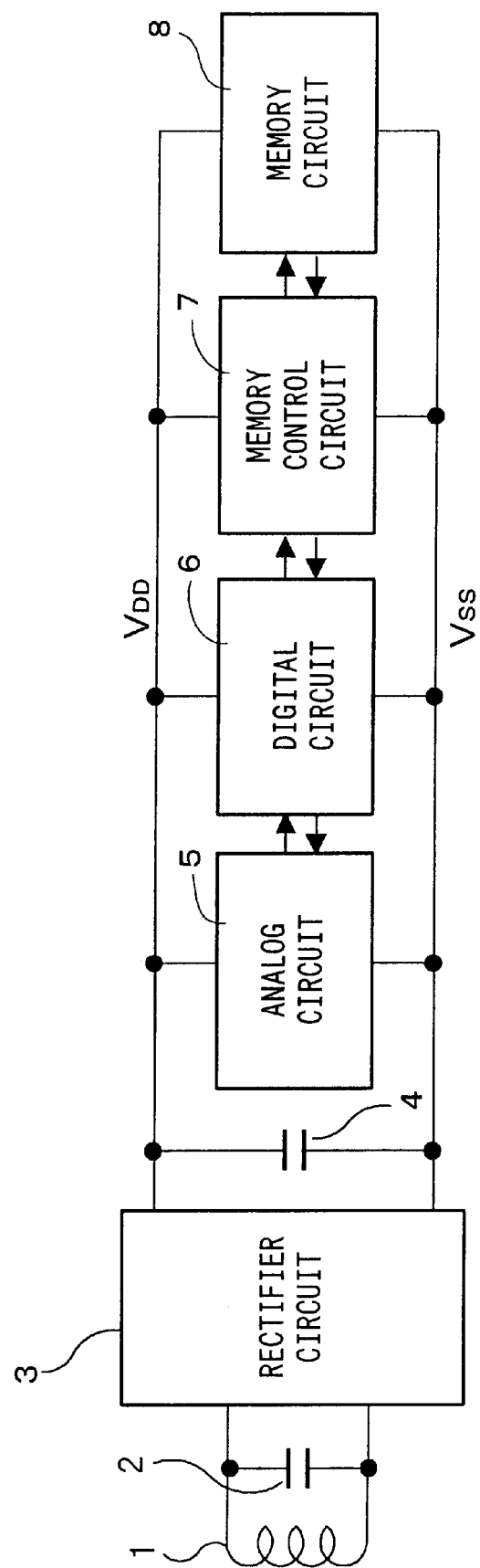
FIG. 7 is a block diagram of an IC chip for a contactless IC card according to the prior art.

FIG. 6 shows another example of the booster circuit 10 (in the first embodiment) shown in FIG. 2. The configuration of the IC chip for contactless IC circuit is the same as that of the first embodiment except for the booster circuit 10.

Provided in this booster circuit 10 are a CMOS inverter 102, PMOS transistors 103, 104, and 105, a NMOS transistor 106, a pumping capacitance 107, a NAND circuit 109, a comparator 110, resistances 111, 112, and nodes $N_1$, $N_2$, $N_3$, $N_4$.

The configuration and operations of the CMOS inverter 102, PMOS transistor 103, PMOS transistor 104, PMOS transistor 105, NMOS transistor 106, and pumping capacitance 107 are the same as in the first embodiment, except the following.

The NAND circuit 109 receives a clock signal CLK and an output signal OUT from the comparator 110 and outputs a inverted signal $\overline{CLK}$. The comparator 110 receives a reference potential REF as a non-inverted input and the potential of node $N_5$ as an inverted input and outputs a signal OUT as the result of the comparison. The resistance 111 is connected between power supply $V_{DDM}$ and node $N_5$ and the resistance 112 is connected between node $N_5$ and power supply $V_{SS}$.

It is assumed that a clock signal generator circuit is provided in a digital circuit 6 for generating a clock signal CLK. A voltage supplied by a separate reference voltage generator is used as the reference potential REF. The reference voltage generator circuit may be a band-gap reference circuit, for example.

It is assumed that a reference potential REF is maintained at 1.2 volts when power supply $V_{DD}$=ca. 2.5 volts and the resistances 111 and 112 are 800 kΩ and 200 kΩ, respectively.

When the resistances 111, 112 are set at these values and power supply $V_{DDM}$=6 volts, the potential at node $N_5$ will be set at 1.2 volts (=6 volts×(200 kΩ/(200 kΩ+800 kΩ))) through the resistance division into resistance 111 and resistance 112.

First, the operation when power supply $V_{DDM}$<6 volts will be described.

When power supply $V_{DDM}$<6 volts, the potential at node $N_5$ is lower than 1.2 volts because of the resistance division into resistances 111, 112. Because the reference potential REF is maintained at 1.2 volts, output signal OUT from the comparator 110 is high. Because signal OUT is high, the NAND circuit 109 outputs the inverted signal of clock signal CLK.

That is, when output signal OUT from the comparator 110 is high, the booster circuit 10 operates as (in the first embodiment) and a charge is provided from the booster 10 to the storage capacitance 9.

Next, the operation when power supply $V_{DDM} \geq 6$ volts will be described.

When $\geq 6$ volts, the potential at node $N_5$ is larger than 1.2 volts because of the resistance division into resistances 111, 112. Because the reference potential REF is maintained at 1.2 volts, output signal OUT from the comparator 110 is low. Because the reference potential REF is low, the output from the NAND circuit 109 is maintained at high level regardless of the status of clock signal CLK.

That is, inverted clock signal $\overline{CLK1}$ goes high, clock signal CLK1 goes low, PMOS transistor 103 is turned off, PMOS transistor 104 is turned on, PMOS transistor 105 is turned off, NMOS transistor 106 is turned on, and then the voltage boost operation ends.

While the operation of the memory circuit 8 continues halted, no current is supplied from the storage capacitance 9 and power supply $V_{DDM}$ keeps increasing and the voltage boost operation will stop when power supply $V_{DDM}$ reaches 6 volts. When the memory circuit 8 operates, consumes a current from the storage capacitance 9, and power supply $V_{DDM}$ becomes lower than 6 volts during the halt of the voltage boost operation, the voltage boost operation will automatically restart.

As described above, because the NAND circuit 109, comparator 110, and resistances 111, 112 are provided for stopping a voltage boost operation when power supply $V_{DDM}$ for the memory circuit exceeds a predetermined voltage because of the operation halt state of the memory circuit, power consumption can be reduced compared with a booster circuit that always performs a voltage boost according to a clock signal CLK. In addition, power supply voltage VDDM for the memory circuit does not exceed a predetermined voltage, deterioration of devices due to an excessive voltage rise can be prevented.

A more effective circuit can be implemented by inserting in series a resistance 108 as (in the second embodiment) in a charging circuit that supplies charges from the output of the booster circuit 10 to the storage capacitance 9 shown in FIG. 6.

As described above, according to the IC chip for contactless IC card of the present invention, a booster circuit is provided to cause a memory circuit comprising nonvolatile memory to operate at a boosted voltage and other circuits in the chip to operate at a lower voltage, thus ensuring the reliability of the nonvolatile memory in data retention or the like, and allowing for lower power consumption. In addition, the power supply line for the memory circuit is separated from the power supply lines for the other circuits, therefore malfunctions in the other circuit due to power-supply noise during a memory circuit operation.

A resistance provided between a boosted voltage output terminal and a storage capacitance produces a difference in impedance and the difference causes a current to be provided from the storage capacitance to the memory circuit, thereby preventing malfunctions in the other circuit due to power-supply noise during memory circuit operation in a case where the memory circuit operates and instantaneously consumes a high current.

In the configuration in which voltage boost operation is stopped when a boosted voltage exceeds a predetermined voltage, power consumption can be reduced and deterioration of devices due to an excessively boosted voltage can be prevented because the boosted voltage does not become higher than the predetermined voltage.

What is claimed is:

1. An IC chip for contactless IC card for rectifying and smoothing a signal provided from an external source to feed electric power to signal processing circuits and a memory circuit both integral with the IC chip and for reading and writing data to and from said memory circuit, comprising:

a rectifier circuit for rectifying a signal received contactlessly from the external source to provide a power supply;

a smoothing capacitor coupled to said rectifier circuit;

an internal signal processing circuit coupled to said rectifier circuit to receive said power supply;

a booster circuit connected to said rectifier circuit to receive said power supply, said booster circuit for boosting a voltage of said power supply and providing a boosted power supply; and a memory circuit coupled to said booster circuit to receive said boosted power supply.

2. The IC chip for contactless IC card according to claim 1, wherein said memory circuit is a ferroelectric memory.

3. The IC chip for contactless IC card according to claim 2, further comprising a storage capacitor coupled to an output of said booster circuit, wherein said booster circuit comprises a pumping capacitor driven by a repetitive clock signal.

4. The IC chip for contactless IC card according to claim 3, wherein said pumping capacitor is coupled to the output of said booster circuit via a resistive element.

5. The IC chip for contactless IC card according to claim 3, wherein said booster circuit further comprises a comparator for comparing a voltage indicative of an output voltage of said booster circuit with a reference voltage and for controlling a boosting operation of said booster circuit.

* * * * *